United States Patent [19]
Horiguchi et al.

[11] Patent Number: 5,952,856
[45] Date of Patent: Sep. 14, 1999

[54] INDUCTIVE LOAD DRIVING METHOD AND H-BRIDGE CIRCUIT CONTROL DEVICE

[75] Inventors: Kenji Horiguchi; Tomoaki Nishi; Shin Nakajima, all of Hanno, Japan

[73] Assignee: Shindengen Electric Manufacturing Co., Ltd., Tokyo, Japan

[21] Appl. No.: 08/841,384

[22] Filed: Apr. 30, 1997

[30] Foreign Application Priority Data

May 2, 1996 [JP] Japan ..................................... 8-135831

[51] Int. Cl.$^6$ ....................................................... H02P 1/22
[52] U.S. Cl. ........................... 327/110; 327/423; 363/98; 318/696; 318/811
[58] Field of Search .................................... 327/110, 423, 327/424; 318/696, 685, 434, 811, 599; 363/98, 58, 132

[56] References Cited

U.S. PATENT DOCUMENTS

| | | | |
|---|---|---|---|
| 4,578,650 | 3/1986 | Watson ..................................... | 331/160 |
| 4,924,158 | 5/1990 | Kelley et al. ............................. | 318/434 |
| 4,950,919 | 8/1990 | Rossi et al. .............................. | 327/424 |
| 5,063,338 | 11/1991 | Capel et al. ............................. | 318/685 |
| 5,084,661 | 1/1992 | Tanaka .................................... | 318/685 |
| 5,315,498 | 5/1994 | Berrios et al. ............................ | 363/98 |
| 5,359,271 | 10/1994 | Husher .................................... | 318/696 |
| 5,444,622 | 8/1995 | Takeshima et al. ............... | 364/424.05 |
| 5,712,550 | 1/1998 | Boll et al. ................................ | 318/434 |

FOREIGN PATENT DOCUMENTS 9505704  2/1995  WIPO .

OTHER PUBLICATIONS

European Search Report (Jul. 22, 1998).

Ericsson "Integrated Circuits Data Book," Sep. 1988, pp. 6–36–6–43, 6–52–6–61.

*Primary Examiner*—Tuan T. Lam
*Attorney, Agent, or Firm*—Stevens, Davis, Miller & Mosher, L.L.P.

[57] ABSTRACT

A current detecting resistor is inserted in an H-bridge circuit constructed to cause the flow of a current to an inductive load in both forward and reverse directions by four semiconductor switching elements and flywheel diodes respectively connected in reverse parallel to the semiconductor switching elements. An inductive load driving method and an H-bridge circuit control device prevent an erroneous operation caused by noise generated at the current detecting resistor. When a current flowing through the inductive load is controlled by a detection voltage generated by the current detecting resistor, the value of the detection voltage is ignored immediately after the connection of the inductive load to a power source. There is no risk that an erroneous operation is caused by a rush current and/or a through current. When a power source regeneration is made to decrease a switching current, the inductive load is connected to the power source at a predetermined period and a current flowing at that time is detected as the detection voltage. There is no risk that the current becomes too small or the transfer to a steady is made while the current is large.

4 Claims, 12 Drawing Sheets

| S | R | Q |
|---|---|---|
| H | H | L |
| H | L | H |
| L | H | L |
| L | L | L |

INDUCTIVE LOAD DRIVING METHOD AND H-BRIDGE CIRCUIT CONTROL DEVICE

BACKGROUND OF THE INVENTION

1. Field of the Invention

The present invention relates to a technique for causing the flow of a switching current to an inductive load by use of semiconductor switching elements, and more particularly, to an inductive load driving method and an H-bridge circuit control device in which an H-bridge is formed by a plurality of semiconductor switching circuits and an inductive load, wherein a switching current flowing through the inductive load is controlled.

2. Description of the Related Art

In general, a stepping motor has a rotor including a rotatable moving magnet around which a plurality of driving coils composed of electromagnets are arranged. In the stepping motor, the position and speed of rotation of the rotor can be controlled in an open-loop manner by selecting one of the driving coils so that a current having a predetermined amplitude flows pulse-wise through the selected driving coil. Therefore, the stepping motors have been widely used as convenient motors.

As a method for driving such a stepping motor, there are widely used a unipolar driving method in which current flows in a fixed direction and a bipolar driving system in which a current flows in both of forward and reverse directions.

In either driving system, the amount of rotation (or step angle), which is a basic matter of the stepping motor, is determined by the number of arranged driving coils. In recent years, however, there has been employed a microstep driving technique in which in order to suppress vibration at the time of rotation or precisely control of angle the rotation, a constant current flowing through the driving coil is step-wise changed, as shown in FIG. 13A, so that the rotor is transiently stopped at an angle smaller than the basic step angle.

In the case where microstep driving is performed, a current detecting resistor is inserted in an H-bridge circuit so that the amplitude of a current supplied from a power source to a stepping motor is detected as a detection voltage which is output at the current detecting resistor. The detection voltage is compared with a predetermined reference voltage to cause the turn-on/off of the semiconductor switching elements so that a switching current 102 having a fixed amplitude, as shown in FIG. 13B, is caused to flow through a driving coil, thereby stopping the rotor at an angle finer than a basic step angle.

Further, for example, in the case where the amplitude of the switching current flowing through the driving coil is to be changed from a current $I_2$ to a current $I_3$ smaller than the current $I_2$, all the semiconductor switching elements are turned off to cause the flow of a regenerative current. Thereby, an energy stored in the driving coil is transferred to the power source so that the current flowing through the driving coil is rapidly decreased, as shown by a leftward descending waveform indicated by reference numeral 103.

In order to prevent a negative voltage from being inputted to a driving circuit for the H-bridge circuit, it is a general technique that the current detecting resistor inserted in the H-bridge circuit is connected such that a current regeneratively returned to the power source does not flow therethrough. Accordingly, it is not possible to detect the current flowing through the driving coil during a time when the switching current is decreased by the power source regeneration.

Therefore, in the prior art, the regenerative current flows only during an estimated time T until the switching current reaches a predetermined value. In that case, the current flowing through the stepping motor may decrease to a smaller value than is required, for example, as shown by a current amount indicated by reference numeral 104. Otherwise, before the current flowing to the stepping motor decreases to a desired current amount, the transfer to a steady operation for flowing a predetermined stepping current may be caused so that a current is supplied to the driving coil. This will cause the vibration of the stepping motor. Also, in the case where the power source regeneration based on such a time setting is performed, it is required that a proper time should be determined for each stepping motor to set a time for power source regeneration again since the value of an inductance and the value of an equivalent resistor change each time the kind of the stepping motor is changed. This is troublesome. A solution to this problem has been desired.

Further, when an energy stored in the driving coil is to be released, it is necessary to cause the flow of a current through a flywheel diode. However, the flywheel diode capable of being incorporated in a power IC having been popularized in recent years is a PN diode and has a long reverse recovery time (Trr). As a result, when the driving coil is connected to the power source after the termination of a period of time for release of the energy stored in the driving coil so that a current is supplied to the driving coil, a reverse through current will flow through the flywheel diode through which a forward current has flowed.

Also, if one of the semiconductor elements is turned on/off with one of the other semiconductor elements remaining in a turned-on a state in order that the switching current flowing through the driving diode is kept at a fixed amplitude, the potential of one end of the driving coil will change on a large scale. Since a stray capacitor equivalently connected in parallel to an inductance component of the driving coil exists in the stepping motor, such large change of the potential of the one end of the driving coil will cause a rush current for charging the stray capacitor.

In the case where such a through current or rush current flows through the current detecting resistor, there will be detected a large current which is not flowing through the inductance component of the driving coil. As a result, there is a problem that the power IC makes an erroneous detection operation.

In the prior art, a countermeasure such as the provision of a noise eliminating filter for the current detecting resistor is taken in order to prevent such an erroneous operation. However, this entails a problem that the cost becomes very high. Therefore, a solution of aft that problem has been desired.

SUMMARY OF THE INVENTION

One object of the present invention for solving the above-mentioned inconveniences of the prior art is to provide an inductive load driving method and an H-bridge circuit control device in which a noise eliminating filter is-not required.

Another object of the present invention is to provide an inductive load driving method and an H-bridge circuit control device in which, when a switching current flowing through an inductive load is decreased, the decrease of the switching current down to a desired amplitude can be detected.

In order to solve the above subjects, a method according to a first aspect of the invention is an inductive load driving method in which an H-bridge circuit constructed to cause the flow of a current to an inductive load in both of forward and reverse directions by four semiconductor switching elements and flywheel diodes respectively connected in reverse parallel to the semiconductor switching elements is used, a current detecting resistor is inserted in the H-bridge circuit so that a current supplied from a power source to the inductive load flows through the current detecting resistor, and a detection voltage outputted by the current detecting resistor at the time of turn-on of two of the semiconductor switching elements is compared with a predetermined reference voltage to cut off the turn-on of the semiconductor switching element(s) so that a switching current flowing through the inductive load is kept in a predetermined amplitude, and the inductive load driving method is characterized in that the detection voltage is ignored during a predetermined blanking period after the turn-on of the two of the semiconductor switching elements.

A method according to a second aspect of the invention is an inductive load driving method in which in an H-bridge circuit constructed to cause the flow of a current to an inductive load in both of forward and reverse directions by four semiconductor switching elements and flywheel diodes respectively connected in reverse parallel to the semiconductor switching elements, a current detecting resistor is inserted so that a current supplied from a power source to the inductive load flows through the current detecting resistor and a current regeneratively returned from the inductive load to the power source does not flow through the current detecting resistor, and a detection voltage outputted by the current detecting resistor at the time of turn-on of two of the semiconductor switching elements is compared with a predetermined reference voltage to cut off the turn-on of the semiconductor switching element(s) so that a switching current flowing through the inductive load is kept in a predetermined amplitude, and the inductive load driving method is characterized in that in the case where the switching current to be kept is decreased., the reference voltage is decreased to cut off all of the four semiconductor switching elements so that an energy stored in the inductive load is regeneratively returned to the power source, and when the energy stored in the inductive load is regeneratively returned to the power source, two of the semiconductor switching elements are turned on at a predetermined period to generate the detection voltage so that the generated detection voltage and the decreased reference voltage are compared to judge whether or not the amplitude of the current flowing through the inductive load is decreased down to a desired value.

A device according to the first aspect of the invention is an H-bridge circuit control device in which in an H-bridge circuit constructed to cause the flow of a current to an inductive load in both of forward and reverse directions by four semiconductor switching elements and flywheel diodes respectively connected in reverse parallel to the semiconductor switching elements, a current detecting resistor is inserted so that a current supplied from a power source to the inductive load flows through the current detecting resistor and a current regeneratively returned from the inductive load to the power source does not flow through the current detecting resistor, and a detection voltage generated across the current detecting resistor is detected to change the turned-on states of the semiconductor switching element(s) to the turned-off states thereof so that the amplitude of a switching current flowing through the inductive load is kept in a predetermined level, and the H-bridge circuit control device is characterized in that the detection voltage is ignored during a predetermined blanking period after the change of two of the semiconductor switching elements to turned-on state.

A device according to the second aspect of the invention is an H-bridge circuit control device in which in an H-bridge circuit constructed to cause the flow of a current to an inductive load in both of forward and reverse directions by four semiconductor switching elements and flywheel diodes respectively connected in reverse parallel to the semiconductor switching elements, a current detecting resistor is inserted so that a current supplied from a power source to the inductive load flows through the current detecting resistor and a current regeneratively returned from the inductive load to the power source does not flow through the current detecting resistor, and a detection voltage generated across the current detecting resistor is detected, and the H-bridge circuit control device is characterized in that when an energy stored in the inductive load is regeneratively returned to the power source for decreasing the amplitude of the switching, two of the semiconductor switching elements are turned on at a predetermined period so that a current is supplied from the power source to the inductive load to generate the detection voltage, and the magnitude of the generated detection voltage is detected to judge whether or not the current flowing through the inductive load is decreased down to a desired amplitude.

According to such a construction of the present invention, in an H-bridge circuit constructed to cause the flow of a current to an inductive load in both forward and reverse directions by four semiconductor switching elements and flywheel diodes respectively connected in reverse parallel to the semiconductor switching elements, a current detecting resistor is inserted so that a current supplied from a power source to the inductive load flows through the current detecting resistor. A detection voltage outputted by the current detecting resistor at the time of turn-on of two of the semiconductor switching elements is compared with a predetermined reference voltage. If the detection voltage is larger than the predetermined reference voltage, the turn-on of the semiconductor switching element(s) is cut off. Thereby, an energy stored in the inductive load is released through the flywheel diode(s) so that a switching current flowing through the inductive load can be kept in a predetermined amplitude.

Immediately after the two semiconductor switching elements are turned on, the flywheel diodes are changed from forward bias states to reverse bias states. At this time, the diode characteristic of the flywheel diode will be lost only during Trr (reverse recovery time) of that diode so that a through current flows.

When the through current flows through the current detecting resistor, the detection voltage will exceed the reference voltage notwithstanding that a small current is flowing through the inductive load. Therefore, after the turn-on of the two semiconductor switching elements, the detection voltage is ignored during a predetermined blanking period so that an erroneous operation caused by the through current is avoided. Thereby, a need to provide a noise eliminating filter is eliminated.

In that case, if the turn-on of only one of the semiconductor switching elements is cut off so that the switching current flowing through the inductive load is kept in the predetermined amplitude, a current path for releasing an energy stored in the inductive load is formed by one semiconductor switching element and one said flywheel diode so that the energy stored in the inductive load is consumed by a forward saturation voltage of the semiconductor switching element and a forward drop voltage of the flywheel diode. As a result, the current flowing through the inductive load is gently attenuated, thereby making it possible to reduce the variations of the switching current.

Also, in an H-bridge circuit constructed to cause the flow of a current to an inductive load in both forward and reverse directions by four semiconductor switching elements and flywheel diodes respectively connected in reverse parallel to the semiconductor switching elements, a current detecting resistor is inserted so that a current supplied from a power source to the inductive load flows through the current detecting resistor and a current regeneratively returned from the inductive load to the power source does not flow through the current detecting resistor. A detection voltage outputted by the current detecting resistor at the time of turn-on of two of the semiconductor switching elements is compared with a predetermined reference voltage to cut off the turn-on of the semiconductor switching element(s) so that a switching current flowing through the inductive load is kept in a predetermined amplitude. In the case where the switching current to be kept is decreased, the reference voltage is decreased to cut off all of the four semiconductor switching elements. As a result, an energy stored in the inductive load is regeneratively returned to the power source, thereby making it possible to quickly decrease the amplitude of the switching current.

At that time, since a current regeneratively returned from the inductive load to the power source does not flow through the current detecting resistor, it is not possible to know the amplitude of a current which is flowing through the inductive load. Therefore, two of the semiconductor switching elements are turned on at a predetermined period so that a current flows through the current detecting resistor to generate a detection voltage. By comparing the generated detection voltage and the decreased reference voltage, it becomes possible to judge whether or not the current flowing through the inductive load is decreased down to a desired value.

In this case too, since the diode characteristic of the flywheel diode through which the current regeneratively returned to the power source has flowed is lost during Trr (reverse recovery time) of that diode, the detection voltage is ignored during a predetermined blanking period after the turn-on of the two semiconductor switching elements. As a result, there is no risk that due to noise caused by a through current, the the detection voltage becomes larger than a value resulting from a current actually flowing through the inductive load so that the current flowing through the inductive load becomes too small.

DESCRIPTION OF THE PREFERRED EMBODIMENT

Embodiments of a device of the present invention will be described together with a method of the present invention by reference to the attached drawings.

(1) Outline of Overall System

Figure 6:
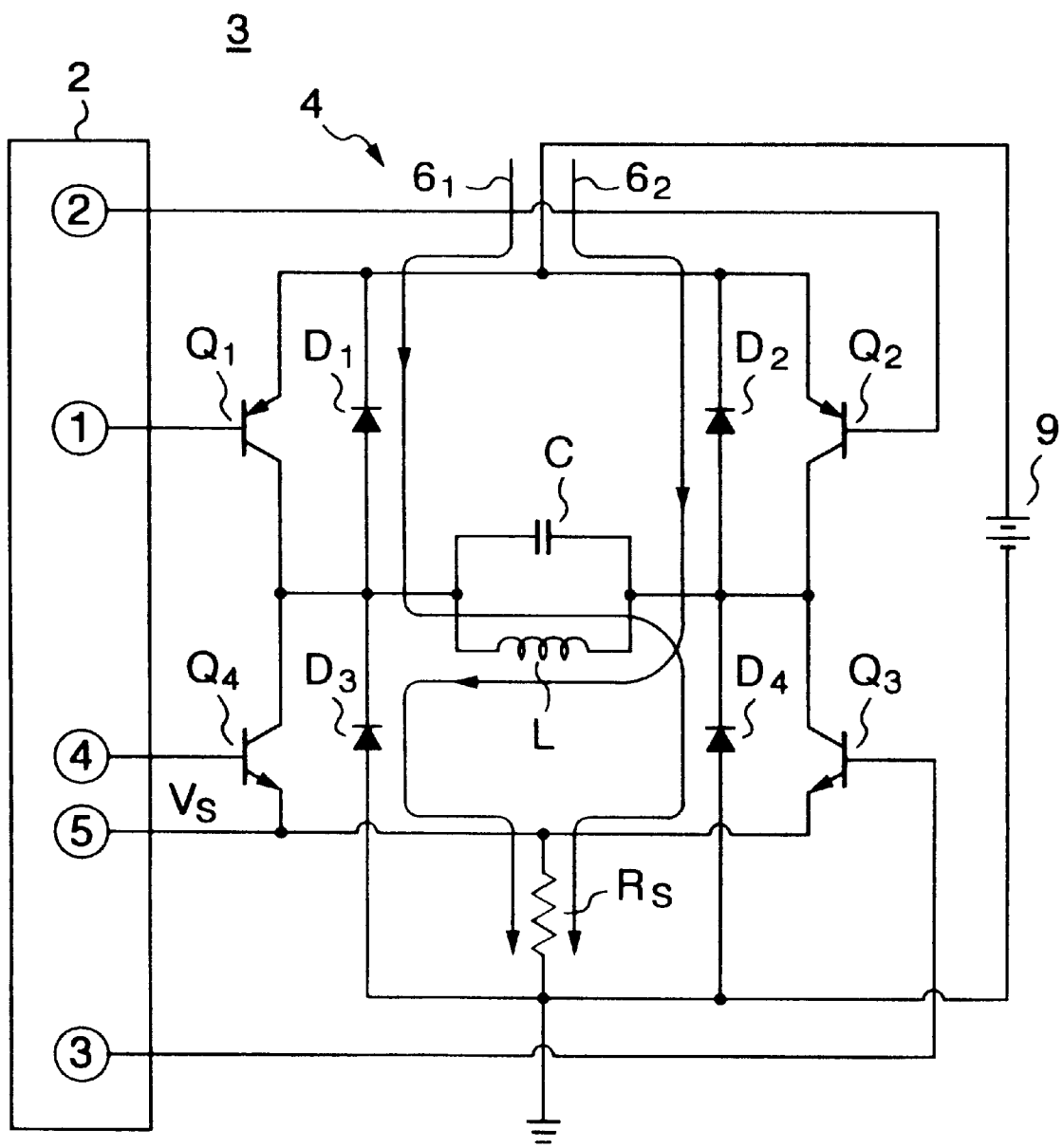
FIG. 6 is a block diagram for explaining the path of a current supplied from a power source to an inductive load.

Referring to FIG. 6, reference numeral 3 denotes a stepping motor control apparatus which has an H-bridge circuit control device 2 according to an embodiment of the present invention and an H-bridge circuit 4.

The H-bridge circuit 4 includes the H-bridge connection of PNP transistors $Q_1$ and $Q_2$ having flywheel diodes $D_1$ and $D_2$ respectively connected in reverse parallel thereto, NPN transistors $Q_3$ and $Q_4$ having flywheel diodes $D_4$ and $D_3$ connected in reverse parallel thereto, and an inductive load (or driving coil) L. The base terminals of the transistors $Q_1$ to $Q_4$ are connected to the H-bridge circuit control device 2. The H-bridge circuit control device 2 is constructed to cause the turn-on of any one of a set of PNP transistor $Q_1$ and NPN transistor $Q_3$ and a set of PNP transistor $Q_2$ and NPN transistor $Q_4$ so that a current is caused to flow from a power source to the inductive load L in either a forward direction or a reverse direction, and it is constructed to cause the turn-off of the transistor having been turned on in that state so that an energy stored in the inductive load L causes a current to flow through the flywheel diodes $D_1$ to $D_4$.

The transistors $Q_1$ to $Q_4$, the flywheel diodes $D_1$ to $D_4$ and the H-bridge circuit control device 2 are formed in the same chip, thereby providing a one-chip power IC structure.

A current detecting resistor $R_S$ constructed by discrete parts is inserted between the interconnected emitter terminals of the NPN transistors $Q_3$ and $Q_4$ and the interconnected cathode terminals of the flywheel diodes $D_3$ and $D_4$. The cathode terminals of the flywheel diodes $D_3$ and $D_4$ are connected to a ground potential.

Either a supply current $6_1$ supplied from the power source 9 to the inductive load L by the turn-on of the set of PNP transistor $Q_1$ and NPN transistor $Q_3$ or a supply current $6_2$ supplied from the power source 9 by the turn-on of the set of PNP transistor $Q_2$ and NPN transistor $Q_4$ flows from the current detecting resistor $R_S$ to the ground potential so that a detection voltage $V_S$ having a value corresponding to the amplitude of the supply current $6_1$ or $6_2$ is outputted from one end of the current detecting resistor $R_S$ and is then inputted to the H-bridge circuit control device 2.

(2) Outline of Internal Block Diagram

Figure 1:
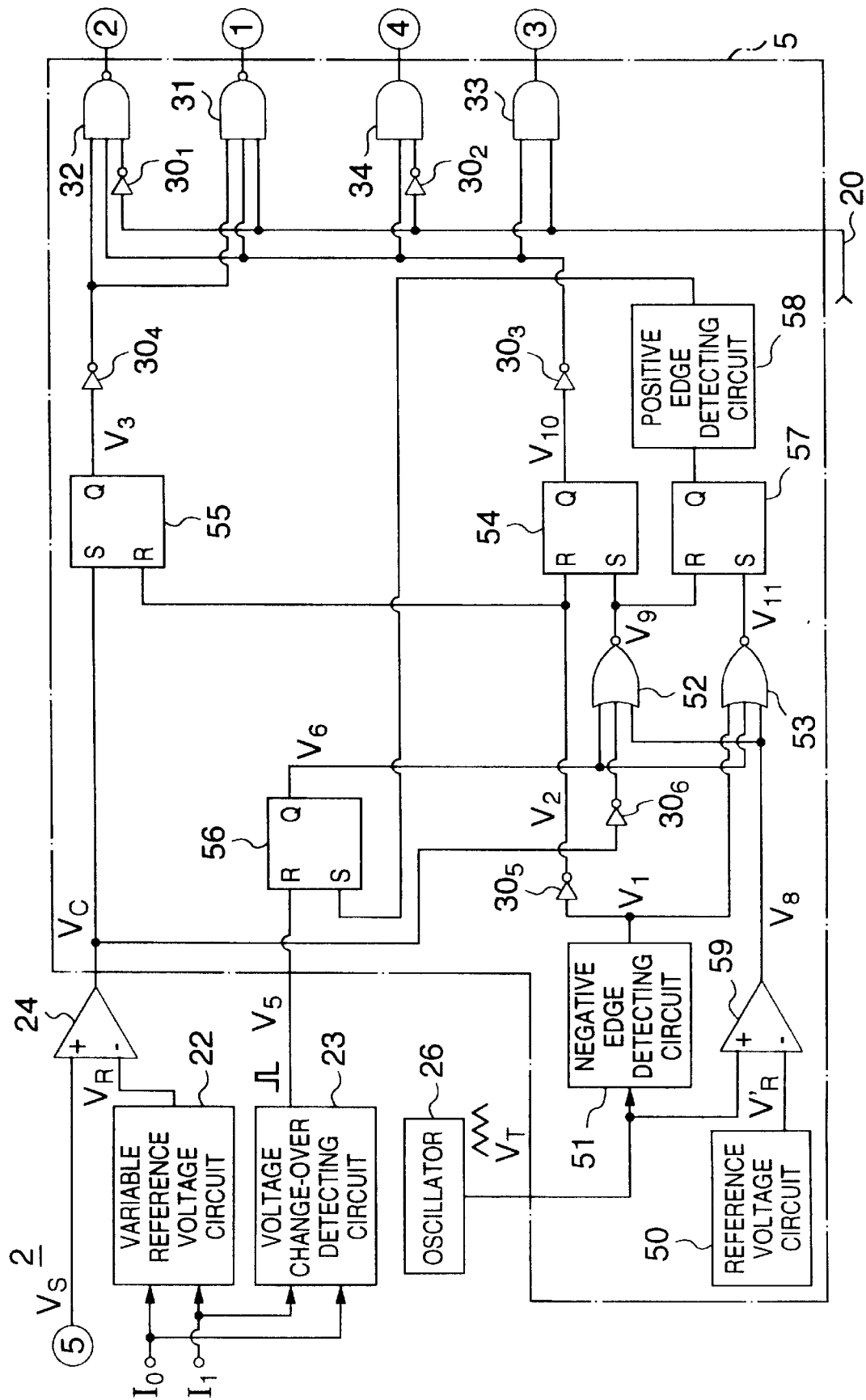
FIG. 1 shows one example of an H-bridge circuit control device according to the present invention.

The internal block diagram of the H-bridge circuit control device 2 is shown in FIG. 1.

The H-bridge circuit control device 2 has a control circuit 5. The control circuit 5 includes two 3-input NAND circuits 32 and 31, two 2-input AND circuits 33 and 34, and inverters $30_1$ and $30_2$.

The output terminals of the 3-input NAND circuits 31 and 32 are connected to the base terminals of the PNP transistors $Q_1$ and $Q_2$, respectively. The output terminals of the 2-input AND circuits 33 and 34 are connected to the base terminals of the NPN transistors $Q_3$ and $Q_4$, respectively.

A transistor selecting line 20 introduced from the exterior is connected to one of the input terminals of each of the 3-input NAND circuit 31 and the 2-input AND circuit 33. The transistor selecting line 20 is also connected to one of the input terminals of each of the 3-input NAND circuit 32 and the 2-input AND circuit 34 through the inverter $30_1$ or $30_2$.

When a signal inputted from the selecting line 20 is "HIGH", the set of PNP transistor $Q_1$ and NPN transistor $Q_3$ are allowed to turn on but the set of PNP transistor $Q_2$ and NPN transistor $Q_4$ are not allowed to turn on. When the signal is "LOW", the set of PNP transistor $Q_2$ and NPN transistor $Q_4$ are allowed to turn on but the set of PNP transistor $Q_1$ and NPN transistor $Q_2$ are not allowed to turn on. Accordingly, only one of the two sets is allowed to turn on so that the power source 9 is not short-circuited. In the following, it is assumed that the transistor selecting line 20 is "HIGH" and only the set of PNP transistor $Q_1$ and NPN transistor $Q_3$ are allowed to turn on.

Inverters $30_3$ and $30_4$ are provided in the control circuit 5. An output terminal of the inverter $30_3$ is connected to an input terminal of each of the 3-input NAND circuits 31 and 32 and the 2-input AND circuits 33 and 34. An output terminal of the inverter $30_4$ is connected to the remaining input terminal of each of the 3-input NAND circuits 31 and 32. Accordingly, when the outputs of the inverters $30_3$ and $30_4$ are both "HIGH", the PNP transistor $Q_1$ and the NPN transistor $Q_3$ are both turned on so that a supply current $6_1$ is supplied from the power source 9 to the inductive load L. When the output of the inverter $30_3$ is "LOW", the PNP transistor $Q_1$ and the NPN transistor $Q_3$ are both turned off irrespective of the output of the inverter $30_4$. When the output of the inverter $30_3$ is "HIGH" and the output of the inverter $30_4$ is "LOW", the PNP transistor $Q_1$ is turned off and the NPN transistor $Q_3$ is turned on.

(3) Outline of Operation

Figure 2:
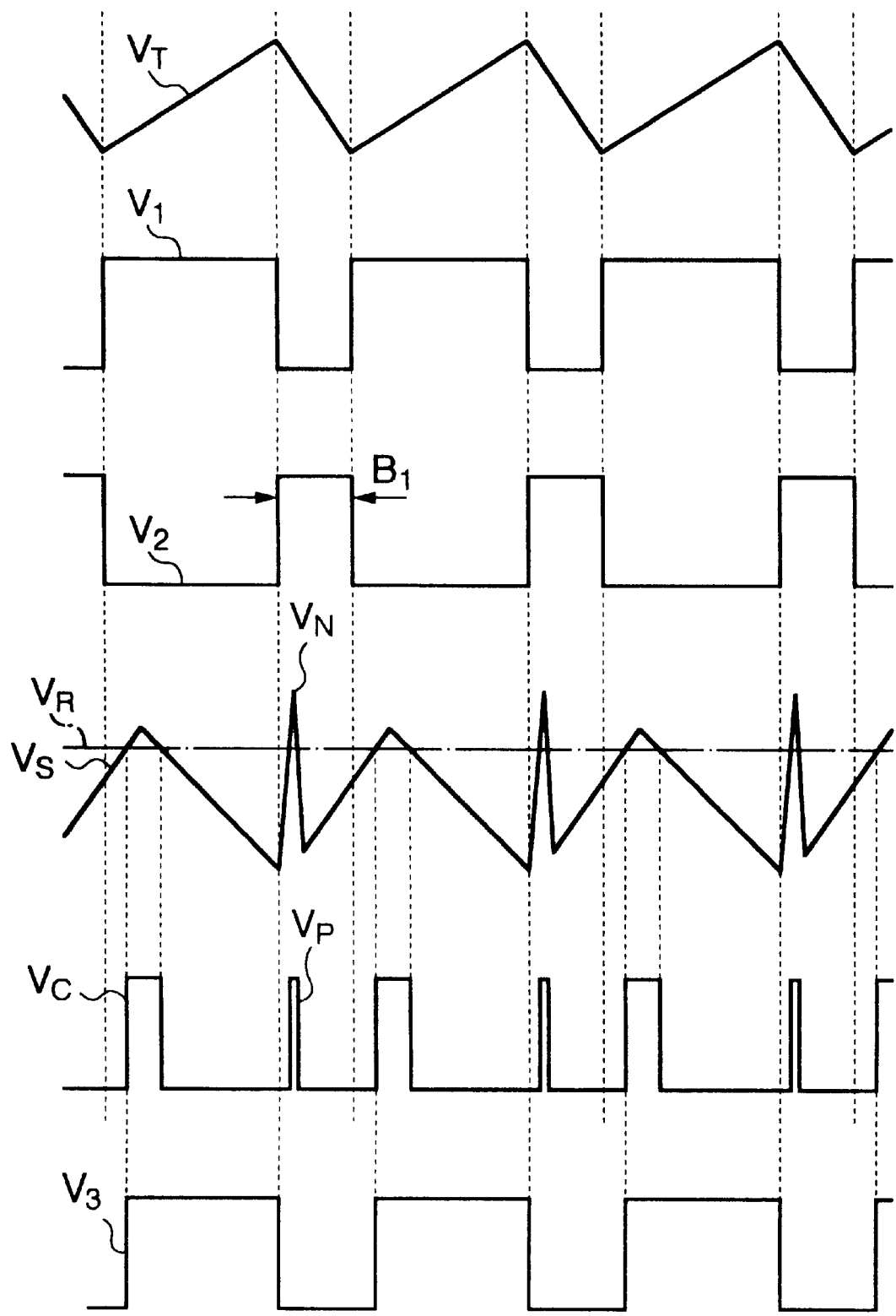
FIG. 2 is a timing chart for explaining a steady operation of the H-bridge circuit control device.

Now, provided that the outputs of the inverters $30_3$ and $30_4$ are both "HIGH" and hence the supply current is flowing through the inductive load L, a detection voltage indicated by symbol $V_S$ in FIG. 2 is being generated across the detecting resistor $R_S$.

Figure 7:
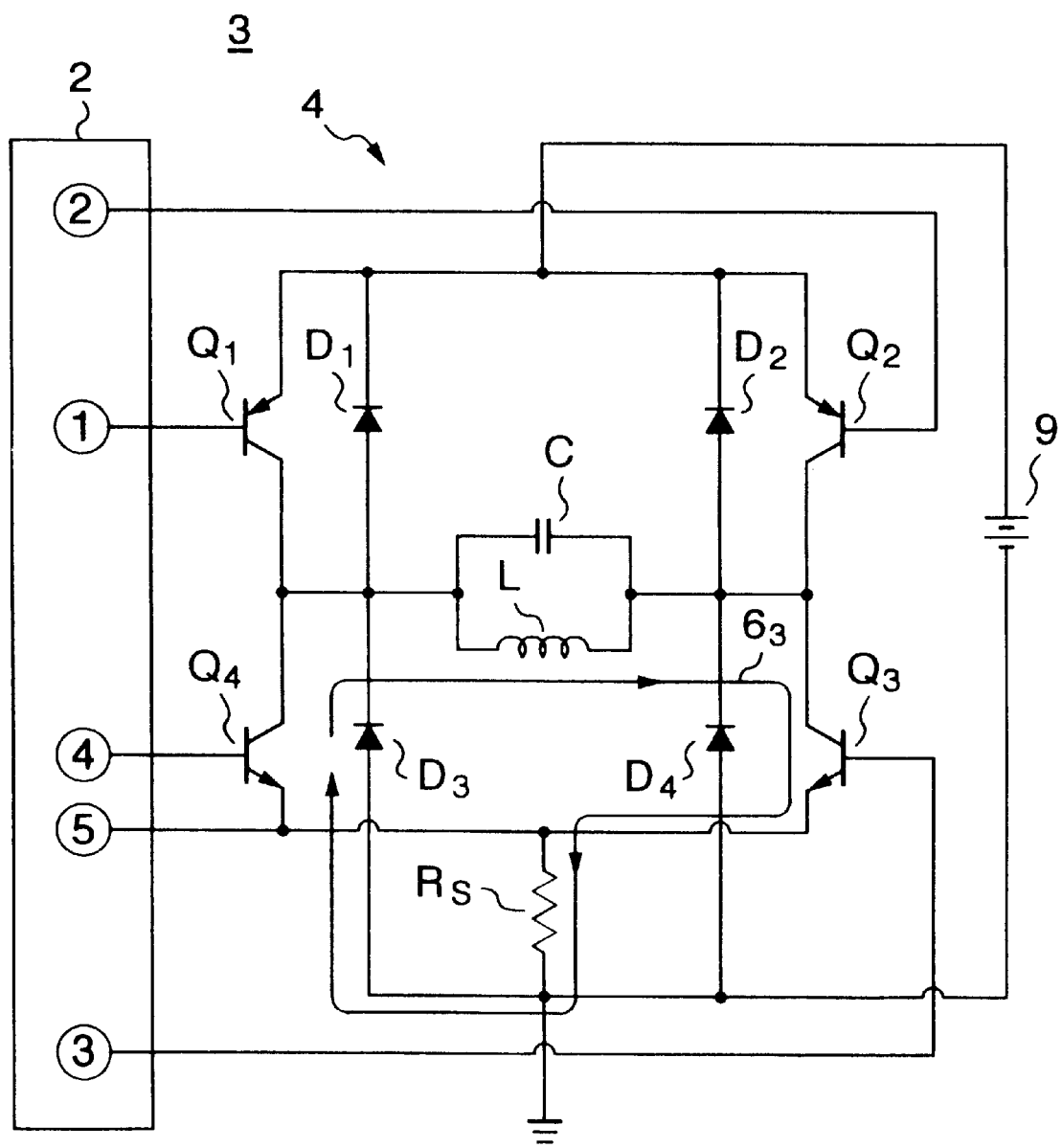
FIG. 7 is a diagram showing the current path of a commutation current flown in the case where an energy stored in the inductive load is released as heat.

When the output of the inverter 303 is turned into "LOW" from such a state, the PNP transistor $Q_1$ is turned off so that a back electromotive force generated across the opposite ends of the inductive load causes the flow of a commutation current $6_3$ in a current path formed by the NPN transistor $Q_3$, the current detecting resistor $R_S$ and the flywheel diode $D_3$, as shown in FIG. 7. Thereby, an energy stored in the inductive load L is consumed as heat.

When the output of the inverter $30_3$ is turned into "HIGH" again from the state in which the commutation current $6_3$ is flowing, the PNP transistor $Q_1$ is turned on so that the supply current $6_1$ is supplied again from the power source to the inductive load L along the current path shown in FIG. 6.

Figure 8:
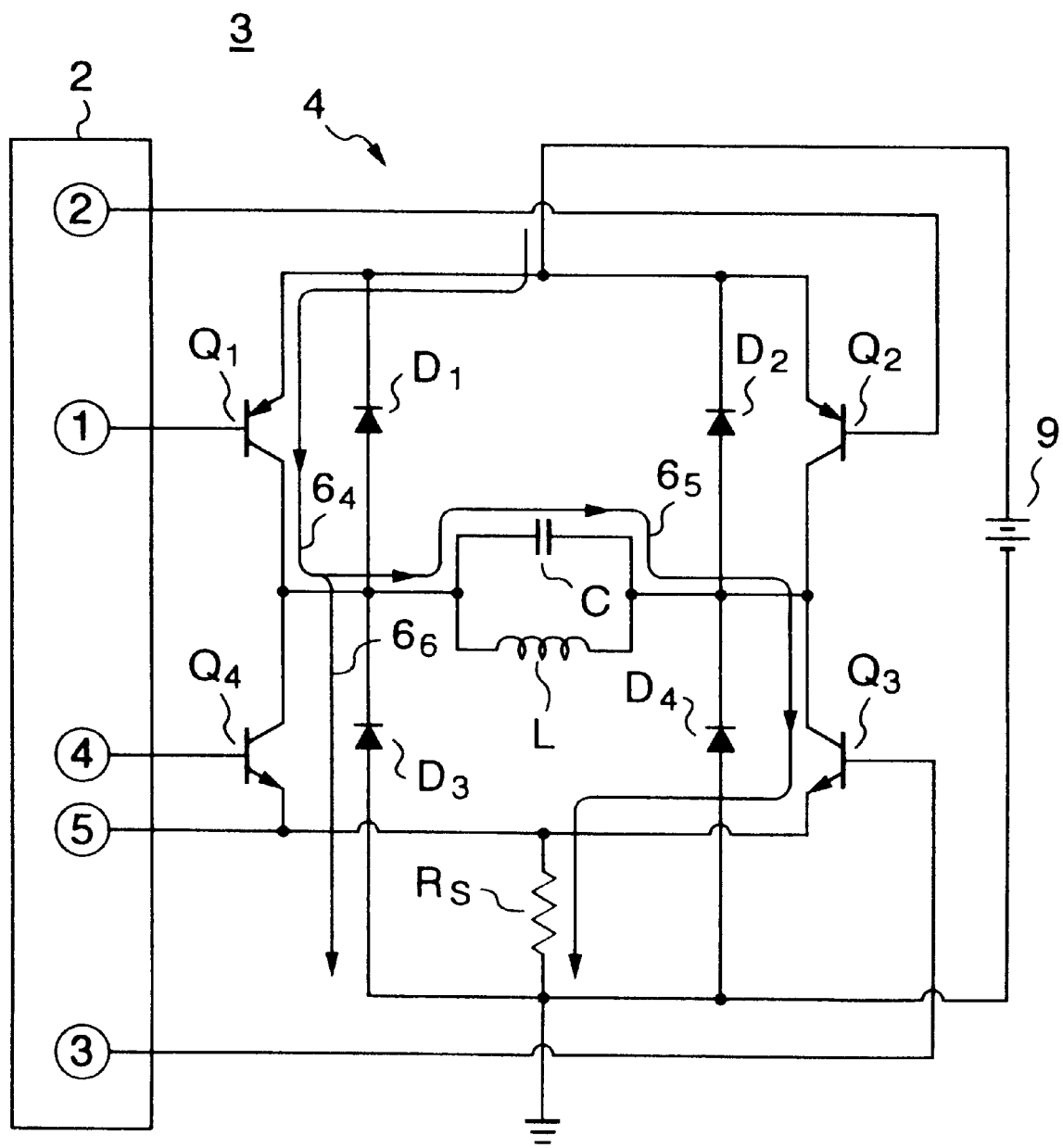
FIG. 8 is a diagram showing a current path in which a through current flows.

At this time, the flywheel diode $D_3$ has a sudden change from a forward bias state to a reverse bias state. Therefore, the diode characteristic of the flywheel diode $D_3$ is lost only during a reverse recovery time Trr of the PN junction diode. As a result, a part of a current $6_4$ flow through the PNP transistor $Q_1$ flows through the flywheel diode $D_3$ in a reverse direction and then to the ground as a through current $6_6$, as shown in FIG. 8.

At the same time, the potential of the side of the inductive load L connected to the collector of the PNP transistor $Q_1$ is suddenly changed from a potential lower than the ground potential by the forward drop voltage of the flywheel diode $D_3$ up to a power source voltage of the power source 9. Therefore, the remaining part of the current $6_4$ flowing through the PNEP transistor $Q_1$ turns into a rush current $6_5$ which charges a stray capacitor C in the stepping motor existing in parallel to the inductive load L. This rush current flows to the detecting resistor $R_S$.

Due to the rush current $6_5$ a noise $V_N$ shown by symbol $V_N$ in FIG. 2 will be generated at the current detecting resistor $R_S$ so that it is superimposed on the detection voltage $V_S$.

A procedure for eliminating the noise $V_N$ will be explained on the basis of the operation of the H-bridge circuit control device 2. The H-bridge circuit control device 2 includes a comparator 24, a variable reference voltage circuit 22, a voltage change-over detecting circuit 23 and an oscillator 26 in addition to the above-mentioned control circuit 5. The outputs of the comparator 24, the variable reference voltage circuit 22, the voltage change-over detecting circuit 23 and the oscillator 26 are connected so that they are inputted to the control circuit 5.

The oscillator 26 is constructed such that a sawtooth wave $V_T$ as shown in a timing chart of FIG. 2 is outputted by a resistor and a condenser externally mounted. First explaining a relationship between the PNP and NPN transistors $Q_1$ and $Q_3$ and the sawtooth wave $V_T$, the PNP transistor $Q_1$ and the NPN transistor $Q_3$ are turned off when the voltage of the sawtooth wave $V_T$ changes from the increase to the decrease. Accordingly, the current $6_1$ begins to be supplied from the power source 9 to the inductive load L at a predetermined period.

On the other hand, in the case where the turned-on state of the NPN transistor $Q_3$ is kept so that the switching current flowing through the inductive load L is kept at a predetermined amplitude, the PNP transistor $Q_1$ is turned off when the detection voltage $V_S$ exceeds a variable reference voltage $V_R$ which the variable reference voltage circuit 22 outputs. Thereby, the commutation current $6_3$ shown in FIG. 7 flows so that the energy stored in the inductive load L is consumed.

(4) Steady Operation

Explaining the operation of the H-bridge circuit control device in more detail, the control circuit 5 is provided with a reference voltage circuit 50, a negative edge detecting circuit 51, a positive edge detecting circuit 58, four FF's (flip-flops) 54 to 57, two 3-input NOR's 52 and 53 and inverters $30_5$ and $30_6$ in addition to the above-mentioned 3-input NAND circuit circuit 31 and so forth. The sawtooth wave $V_T$ outputted by the oscillator 26 is inputted to the negative edge detecting circuit 51. The negative edge detecting circuit 51 outputs a signal, as shown by symbol $V_1$ in FIG. 2, which becomes "HIGH" at the rising portion of the sawtooth wave $V_T$ and "LOW" at the falling portion thereof. This signal $V_1$ is inputted to the inverter $30_5$. The inverter $30_5$ outputs an inverted version $V_2$ of the signal $V_1$ to the reset terminals R of the FF's 54 and 55.

Figures 11, 12:
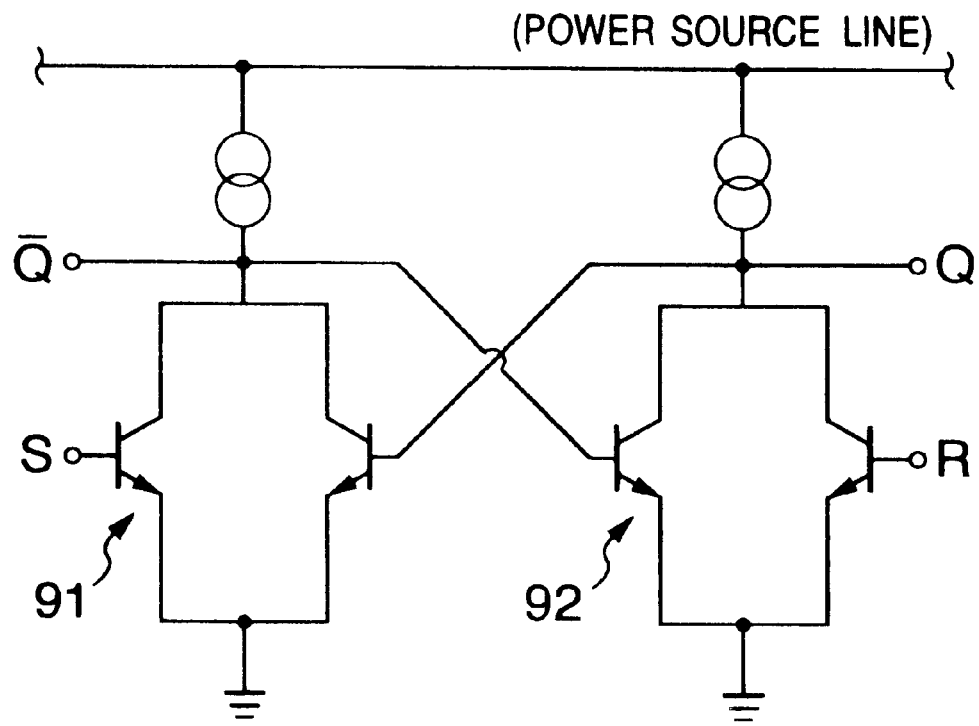
FIG. 11 is a circuit diagram for explaining the construction of a flip-flop used in the H-bridge circuit control device according to the present invention.
FIG. 12 shows a truth table of FF54 to FF57.
Figure 13A:
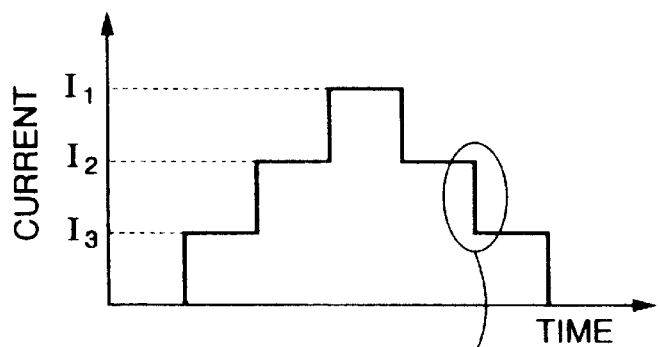
FIG. 13A is a graph for explaining current flow in the case where a stepping motor is microstep-operated and FIG. 13B is a graph for explaining a current control method for an H-bridge circuit control device according to the prior art.
Figure 13B:
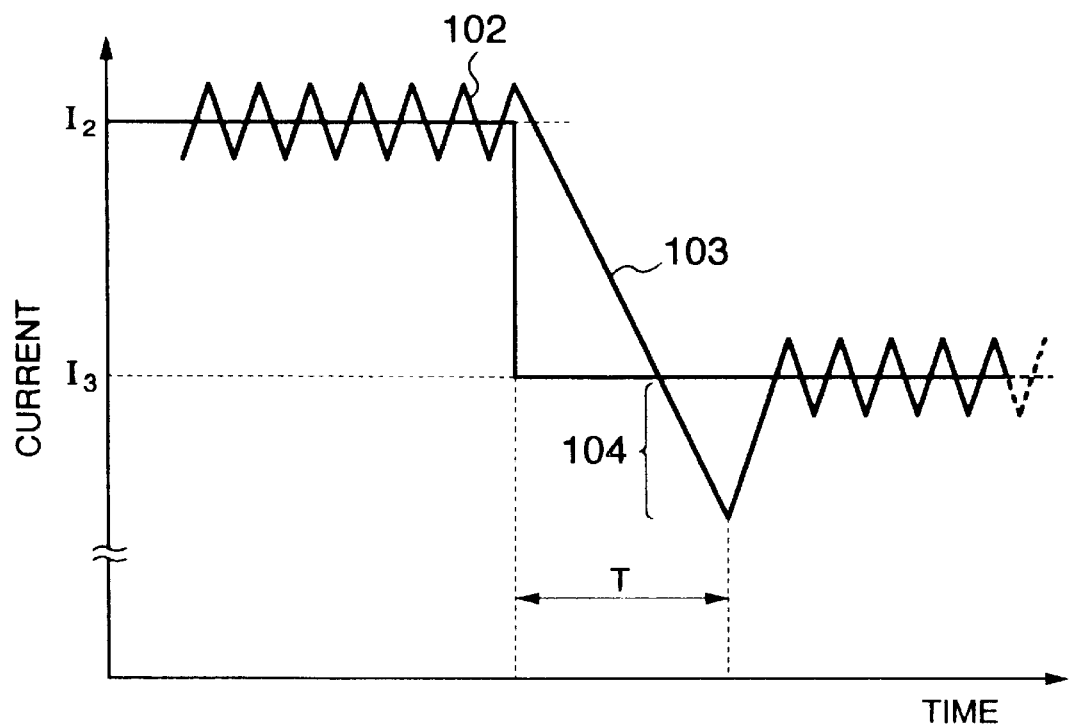

Each of the four flip-flops (or FF's 54 to 57) has two comparators 91 and 92 each including two NPN transistors and a constant current load, as shown in FIG. 11. The comparators 91 and 92 are constructed such that one input and one output are cross-connected. The remaining inputs are a set terminal S and a reset terminal R. Also, the output of the comparator 92 on the reset terminal R side is taken out as an output terminal Q to the exterior. In the FF's 54 to 57, the state of the output terminal Q is necessarily "LOW" in a state in which the reset terminal is "HIGH" (reset terminal preference).

A relationship between the set and reset terminals S and R of each of the FF's 54 to 57 and the output terminal Q thereof is shown as a truth table by the following Table 1. It is not necessarily required that the FF's 54 to 57 should be constructed by bipolar transistors. They may be constructed by CMOS; transistors so long as the operation is attained according to the truth table as shown in FIG. 12.

During a time when the voltage of the sawtooth wave $V_T$ is increasing, the reset terminals R of the FF's 54 and 55 are kept in "HIGH" states and hence the output terminals Q thereof are kept in "LOW" states. Since the output terminal Q of the FF 54 is connected to the 3-input NAND circuit 31 and the 2-input AND circuit 33 through the inverter 30₃, "HIGH" is inputted to the 3-input NAND circuit 31 and the 2-input AND circuit 33 during the time when the voltage of the sawtooth wave $V_T$ is increasing.

Now, provided that the output terminal Q of the FF 56 is kept in a "HIGH" state, the "HIGH" signal outputted by the FF 56 is inputted to the 3-input NOR's 52 and 53 so that signals outputted by the 3-input NOR's 52 and 53 are kept "LOW" irrespective of the states of the remaining inputs.

Since the kept "LOW" is inputted to the set terminal S of the FF 54, the output terminal Q thereof is kept in a "LOW" state. Accordingly, the inverter 30₃ continues to output "HIGH" to the 3-input NAND circuit 31 and the 2-input AND circuit 33.

The selecting line 20 assumes a "HIGH" state. The 3-input NAND circuit 31 and the 2-input AND circuit 33 cause the turn-on of the PNP transistor $Q_1$ and the turn-on of the NPN transistor $Q_3$, respectively, when all the input terminals of the NAND circuit 31 and all the input terminals of the AND circuit 33 are "HIGH". Therefore, the NPN transistor $Q_3$ remains turned On. The PNP transistor $Q_1$ is turned on when the output of the inverter 30₄ is "HIGH" or the output terminal Q of the FF 54 is "LOW" and is turned off when the output terminal Q of the FF 54 is "HIGH".

The inverter 30₄ is inputted with a signal which the FF 55 outputs and is shown by symbol $V_3$ in FIG. 2. The reset terminal R of the FF 55 is inputted with the signal $V_2$ which the inverter 30₃ outputs. Accordingly, when the signal $V_1$ outputted by the negative edge detecting circuit 51 turns into "LOW" and hence the signal $V_2$ turns into "HIGH", the reset terminal R of the FF 55 is raised. Thereby, the $V_3$ outputted by the FF 55 turns into "LOW" so that the transistor $Q_1$ is turned on.

On the other hand, the set terminal S of the FF 55 is inputted with the output $V_C$ of the comparator 24. Further, a non-inverted input terminal of the comparator 24 is inputted with the detection voltage $V_S$. Also, an inverted input terminal of the comparator 24 is inputted with the variable reference voltage $V_R$ which the variable reference voltage circuit 22 outputs.

The output $V_C$ of the comparator 24 is "LOW" when the supply current $6_1$ flowing through the current detecting resistor $R_S$ is still small so that the detection voltage $V_S$ is below the variable reference voltage $V_R$. When the supply current $6_1$ increases so that the detection voltage $V_S$ exceeds the variable reference voltage $V_R$, the output $V_C$ of the comparator 24 turns into "HIGH". Accordingly, when the detection voltage $V_S$ exceeds the variable reference voltage $V_R$, the set terminal S of the FF 55 is raised so that the output voltage $V_3$ turns into "HIGH". At this time, the PNP transistor $Q_1$ is turned off When the voltage of the sawtooth wave $V_T$ begins to decrease after the turn-off of the PNP transistor $Q_1$, the signal $V_2$ outputted by the inverter 30₅ turns into "HIGH" so that the reset terminal R of the FF 55 is raised. Thereby, the signal $V_3$ outputted by the FF 55 turns into "LOW" so that the PNP transistor $Q_1$ is turned on again.

At this time, since a rush current shown by symbol $6_5$ in FIG. 8 flows through the current detecting resistor $R_S$, the detection voltage $V_S$ having a pulse-like noise $V_N$ superimposed thereon will be inputted to the non-inverted input terminal of the comparator 24. In the case where the noise $V_N$ is larger than the variable reference voltage $V_R$, a pulse shown by symbol $V_P$ in FIG. 2 will be outputted from the comparator 24.

The flywheel diode having a PN junction formed in a one-chip power IC has the length of Trr equal to about 0.1 to 0.2 μsec. During Trr, the PNP transistor $Q_1$ makes an active operation. Therefore, during the lapse of Trr, the potential of one end of the stray capacitor C is changed from a potential lower than the ground potential by the forward drop voltage of the flywheel diode $D_3$ up to the power source voltage of the power source 9. Thereby, the rush current $6_5$ flows until Trr expires. Accordingly, the width of the noise $V_N$ is the same as the length of Trr and the width of the pulse $V_P$ does not exceed the width of the noise $V_N$.

A time from the beginning of decrease of the voltage of the sawtooth wave $V_T$ followed by the turn-on of the PNP transistor $Q_1$ until the voltage of the sawtooth wave $V_T$ begins to increase again, that is, a period of time when the signal $V_2$ is "HIGH", is set to have the width of about 2 μsec. Therefore, during at least a time when the pulse $V_P$ is outputted from the comparator 24, the reset terminal R of the FF 55 is kept in its "HIGH" state. Accordingly, even if the pulse $V_P$ raises the set terminal S of the FF 55, the output voltage $V_3$ remains "LOW" and there is no risk that the rush current $6_5$ causes the turn-off of the PNP transistor $Q_1$.

During the period of time when the signal $V_2$ is "HIGH", the detection voltage $V_S$ outputted by the current detecting resistor $R_S$ is thus ignored. Therefore, this period will be called a first blanking period $B_1$. When the first blanking period $B_1$ expires, the signal $V_2$ inputted to the reset terminal R of the FF 55 turns into "LOW" so that the FF 55 turns into an operable state, thereby enabling the turn-off of the PNP transistor $Q_1$. After the turn into the operable state, the current 61 supplied from the power source 9 to the inductive load L increases. When the detection voltage $V_S$ exceeds the variable reference voltage $V_R$, the output $V_C$ of the comparator 24 turns into "HIGH". Thereby, the set terminal S of the FF 55 is raised so that the PNP transistor $Q_1$ is turned off.

During the operation explained above, the NPN transistor $Q_3$ remains turned on. Accordingly, when the PNP transistor $Q_1$ is placed in the turned-off state, an energy stored in the inductive load L causes the flow of a commutation current $6_3$ in a current path, as shown in FIG. 7, which is formed by the NPN transistor $Q_3$ and the flywheel diode $D_3$. Thus, the energy is slowly attenuated while being consumed as heat by the NPN transistor $Q_3$ and the flywheel diode $D_3$.

The foregoing corresponds to the case where the variable reference voltage $V_R$ is fixed. The signal $V_3$ outputted by the FF 55 turns into "LOW" at a fixed period to cause the turn-on of the PNP transistor $Q_1$ and the comparator 24 causes the turn-off of the PNP transistor $Q_1$ at a fixed period. Therefore, the supply current $6_1$ supplied from the power source 9 and the commutation current $6_3$ for releasing the stored energy alternately flows through the inductive load L so that a switching current formed thereby is kept in a fixed amplitude.

(5) Switching Current Attenuating Operation

Next, explanation will be made of the case where the variable reference voltage $V_R$ is decreased to decrease the switching current flowing through the inductive load L.

A circuit for generating signals for changing over a reference voltage is provided at the exterior of the H-bridge circuit control device 2, and reference voltage change-over signals $I_0$ and $I_1$ outputted by the change-over signal generating circuit are inputted to the variable reference voltage circuit 22.

Each of the reference voltage change-over signals $I_0$ and $I_1$ is a signal which takes two values of "HIGH" and "LOW". The variable reference voltage circuit 22 is constructed such that it can output a variable reference voltage $V_R$ having four kinds of magnitudes corresponding to the combination of the values of the reference voltage change-over signals $I_0$ and $I_1$.

The reference voltage change-over signals $I_o$ and $I_1$ are also inputted to the voltage change-over detecting circuit 23. When one of the reference voltage change-over signals $I_0$ and $I_1$ is changed from "LOW" to "HIGH" so that the variable reference voltage $V_R$ from the variable reference voltage circuit 22 is decreased, the voltage change-over detecting circuit 23 detects a positive edge indicating the change from "LOW" to "HIGH" to outputs a pulse shown by symbol $V_5$ in FIG. 3. This pulse $V_5$ is inputted to the reset terminal R of the FF 56 so that a signal $V_6$ outputted from the output terminal Q of the FF 56 is changed from "HIGH" to "LOW". This signal $V_6$ is inputted to the 3-input NOR's 52 and 53, thereby starting an operation for decreasing the switching current.

Figure 4:
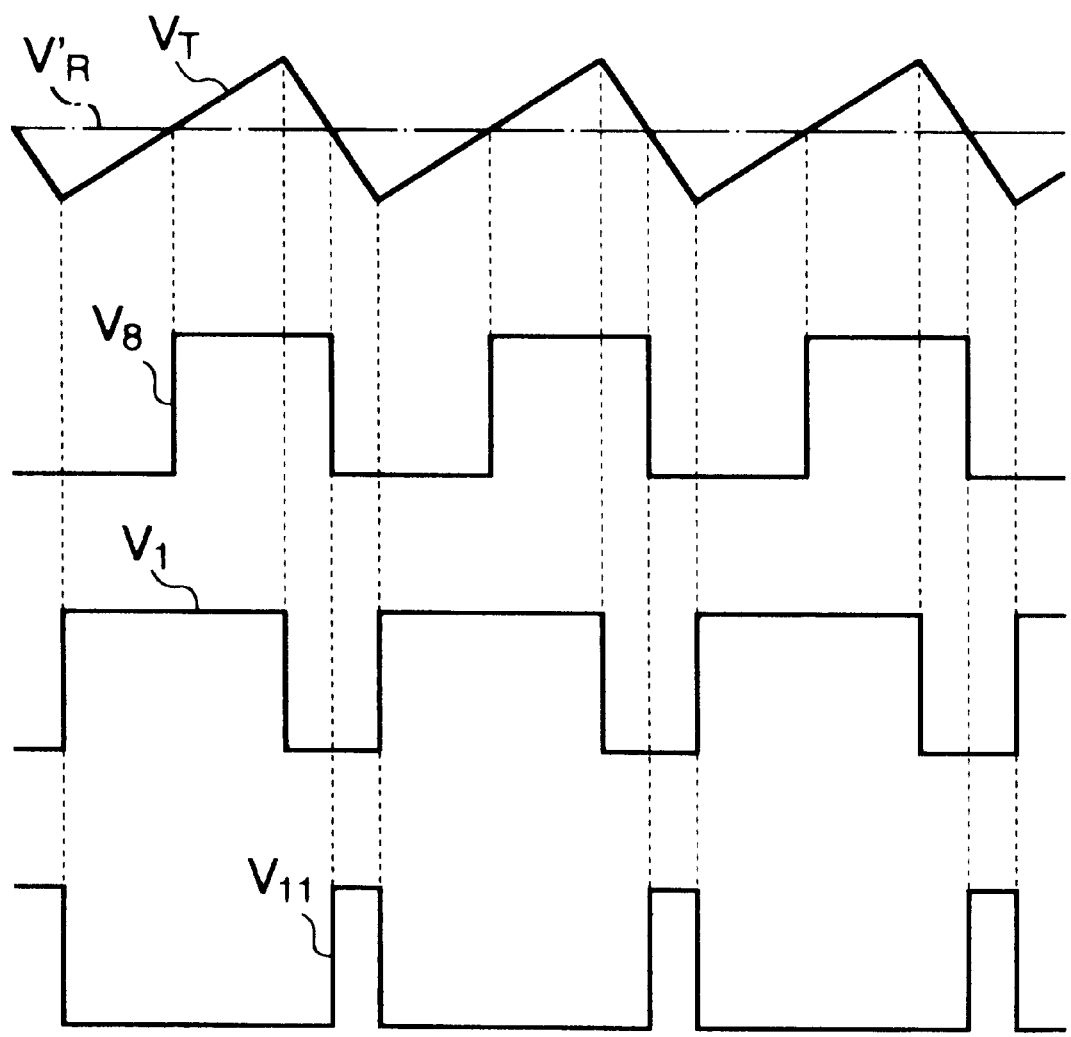
FIG. 4 is a timing chart for explaining an operation when a power source regeneration is being made.

The 3-input NOR 53 is inputted with the signal $V_6$ outputted by the FF 56 as well as the output $V_8$ of a comparator 59 and the signal $V_1$ outputted by the negative edge detecting circuit 51. The comparator 59 is constructed such that it has an inverted input terminal inputted with a reference voltage $V'_R$ outputted by the reference voltage circuit 50 and a non-inverted input terminal inputted with the sawtooth wave $V_T$ outputted by the oscillator 26 to compare the reference voltage $V'_R$ and the sawtooth wave $V_T$ and it provides the output $V_8$ of "HIGH" during a time when the sawtooth wave $V_T$ exceeds the reference voltage $V'_R$. Since the signal $V_6$ is "low", a signal $V_{11}$ outputted by the 3-input NOR 53 turns into "HIGH" when both the output $V_8$ and the signal $V_1$ outputted by the negative edge detecting circuit 51 turn into "LOW", as shown in FIG. 4.

On the other hand, the 3-input NOR 52 is inputted with the voltage $V_6$ outputted by the FF 56 as well as the output $V_8$ of the comparator 59 and a signal outputted by the inverter 306 which inverts the output $V_C$ of the comparator 24.

At the beginning of decrease of the variable reference voltage $V_R$, a current flowing through the inductive load L has little decrease and hence the detection voltage is large. Therefore, the output $V_C$ of the comparator 24 is "HIGH" so that the 3-input NOR 52 is inputted with a "LOW" signal from the inverter $30_6$.

Also, the signal $V_6$ is "LOW". Accordingly, an output signal of the 3-input NOR 52 takes "LOW" when the output $V_8$ of the comparator 59 is "HIGH" and takes "HIGH" when the output $V_8$ of the comparator 59 is "LOW". Namely, the 3-input NOR circuit 52 operates as an inverter for the comparator 59 in such a manner that an inverted version of the output $V_8$ or a signal shown by symbol $V_9$ in FIG. 3 is outputted to the set terminal S of the FF 54 and the reset terminal R of the FF 57.

The reset terminal R of the FF 54 is inputted with the signal $V_2$ in a version of the output $V_1$ of the negative edge detecting circuit 51 inverted by the inverter $30_5$. The FF 54 is constructed such that the output terminal Q is always "LOW" in a state in which the reset terminal R is "HIGH".

Figure 3:
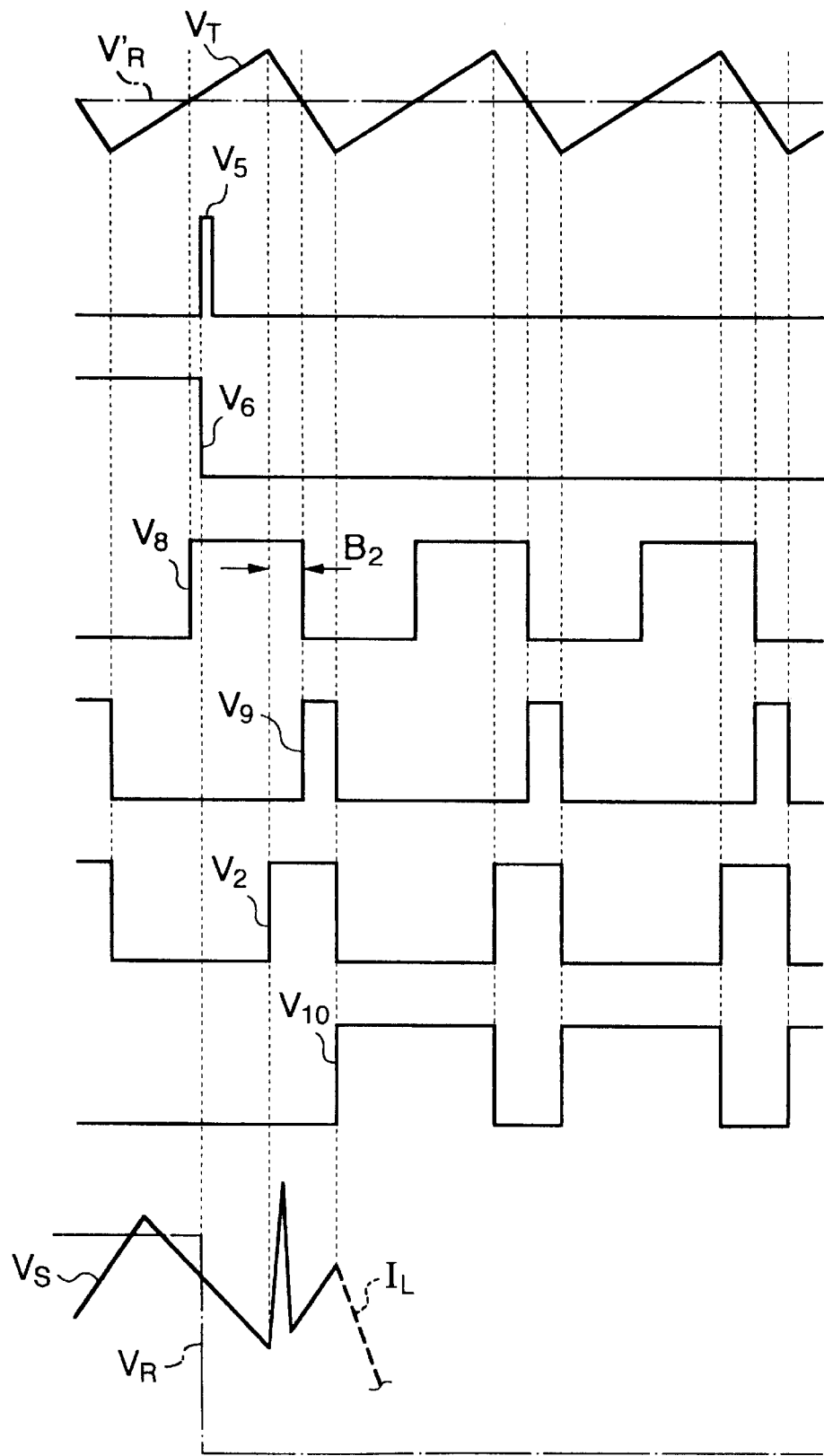
FIG. 3 is a timing chart for explaining an operation when a variable reference voltage is changed over.

Therefore, as shown by symbol $V_{10}$ in FIG. 3, a signal outputted by the FF 54 takes "LOW" only during a time when the voltage of the sawtooth wave $V_T$ is decreasing.

The signal $V_9$ outputted by the 3-input NOR 52 and the signal $V_{11}$ outputted by the 3-input NOR 53 are synchronous with each other. Therefore, when the set terminal S of the FF 57 is "HIGH", the reset terminal R thereof is also "HIGH" and hence the output terminal Q of the FF 57 is kept "LOW".

The signal $V_{10}$ outputted from the FF 54 is applied to the 3-input NAND circuit 31 and the 2-input AND circuit 33 after the inversion thereof by the inverter $30_3$.

Though the signal $V_3$ outputted from the FF 55 is inputted to the 3-input NAND circuit 31 after the inversion thereof by the inverter $30_4$, the set terminal S of the FF 55 is kept in its "HIGH" state until the current flowing through the inductive load L finishes decreasing. At this time, the reset terminal R of the FF 55 is inputted with the signal $V_2$ which takes "HIGH" only during the time when the voltage of the sawtooth wave $V_T$ is decreasing. Since a preference to the input of the reset terminal R is made, the signal $V_3$ outputted by the FF 55 takes "LOW" during the time when the voltage of the sawtooth wave $V_T$ is decreasing. This signal $V_3$ is inputted to the 3-input NAND circuit circuit 31 after the inversion thereof by the inverter $30_4$.

Accordingly, only during a time when the signal $V_3$ and the signal $V_{10}$ are both "LOW", all of the input terminals of the 3-input NAND circuit 31L are "HIGH" so that the PNP transistor $Q_1$ is turned on. This time corresponds to the period of time when the voltage of the sawtooth wave $V_T$ is decreasing. At this time, the signals inputted to the 2-input AND circuit 33 are all "high". Therefore, the NPN transistor $Q_3$ is also turned on so that a supply current 61 is supplied from the power source 9 to the inductive load L. Thereby, a current flows through the current detecting resistor $R_S$ to generate a detection voltage $V_S$.

Figure 10:
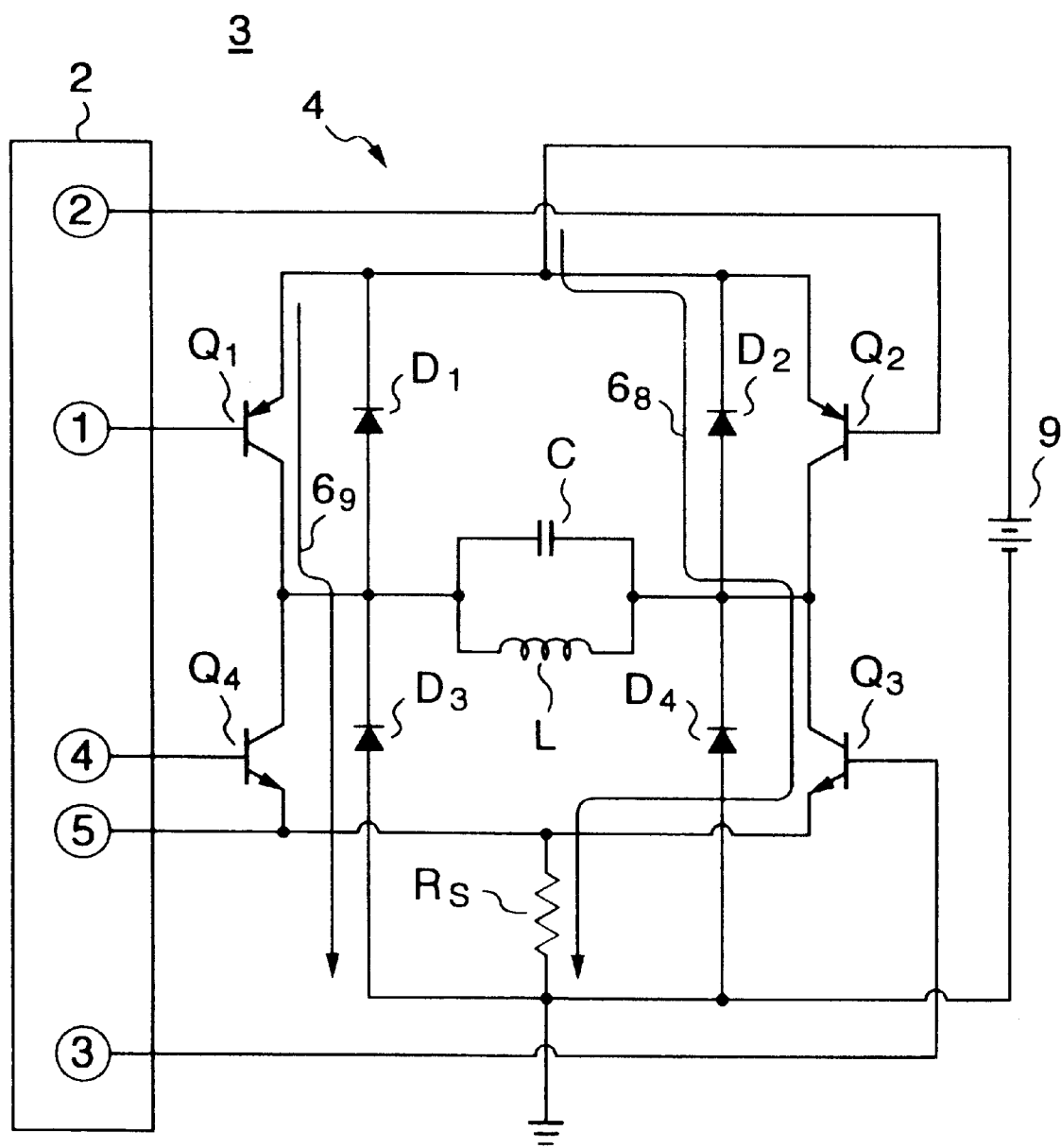
FIG. 10 is a diagram showing the path of a through current when the power source regeneration is made.

This detection voltage $V_S$ and the variable reference voltage $V_R$ are compared by the comparator 24, and the output $V_C$ as the result of comparison is inputted to the 3-input NOR 52 through the inverter $30_6$. When the voltage of the sawtooth wave $V_T$ begins to decrease, that is, in the period of Trr from an instant of time when the PNP transistor $Q_1$ and the NPN transistor $Q_3$ are turned on, through currents $6_8$ and $6_9$ as shown in FIG. 10 will flow through the flywheel diodes $D_1$ and $D_3$. Since the current $6_8$ of the through currents $6_8$ and $6_9$ flows through the current detecting resistor $R_S$, noise will be superimposed on the detection voltage $V_S$. Especially, if such noise is generated when the current flowing through the inductive load L becomes sufficiently small so that the detection voltage $V_S$ is below the variable reference voltage $V_R$, the noise makes the circuit operation unstable.

In the H-bridge circuit control 2, even in the case where such noise is superimposed on the detection voltage $V_S$ when the power source regeneration is made, "HIGH" is inputted to the 3-input NOR 52 until the sawtooth wave $V_T$ becomes below the variable reference voltage VR. A period of time until the voltage of the sawtooth wave $V_T$ becomes below the variable reference voltage $V_R$ after the voltage of the sawtooth wave $V_T$ begins to decrease, will be called a second blanking period B2. During the second blanking period $B_2$, "HIGH" is inputted to one input terminal of the 3-input NOR 52 and hence the output terminal Q of FF54 or FF57 is kept in its "LOW" state even if the superimposed noise are inputted to the other input terminals of the 3-input NOR 52. Accordingly, even if the noise is generated, there is no risk that the FF 54 and 57 make erroneous operations.

Figure 9:
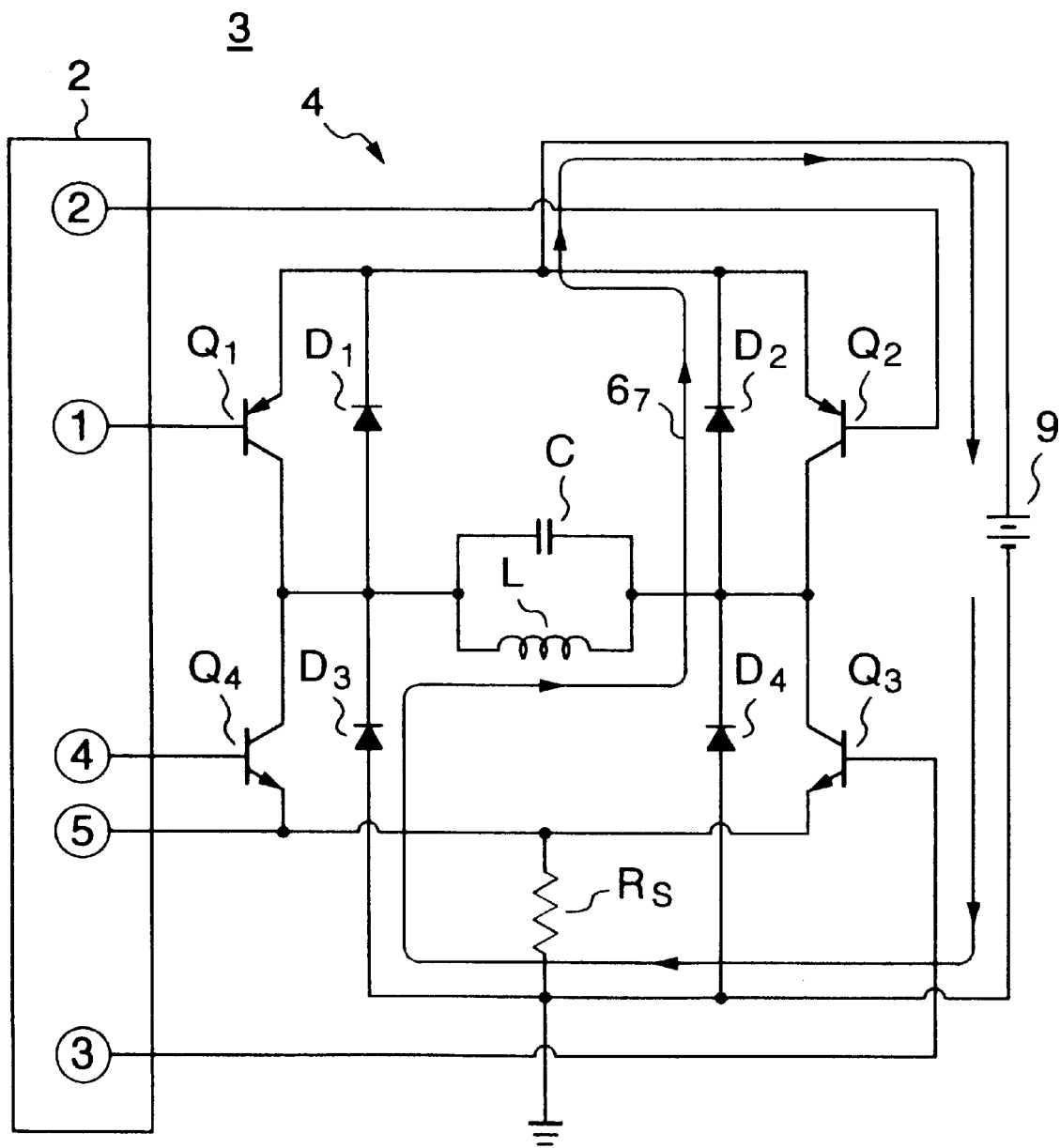
FIG. 9 is a diagram showing a current path in the case where an energy stored in the inductive load is regeneratively returned to the power source.

As mentioned earlier, the output of the inverter $30_3$ takes "HIGH" only during the period of time when the voltage of the sawtooth wave $V_T$ is decreasing. Therefore, in a period of time when the voltage of the sawtooth wave $V_T$ increases, that is, in a period of time when the signal $V_{10}$ is "HIGH", the output of the inverter $30_3$ is "LOW" and hence the PNP transistor $Q_1$ and the NPN transistor $Q_3$ are both turned on. At the time of change from the turn-on to the turn-off, a back electromotive force is generated by an energy stored in the inductive load L so that a regenerative current $6_7$ flows in a path including the inductive load L, the flywheel diode $D_2$, the power source 9 and the flywheel diode $D_3$, as shown in FIG. 9. Since this regenerative current $6_7$ charges an output condenser included in the power source 9, the energy released from the inductive load L moves toward the power source.

A time when the energy stored in the inductive load L is released by the regenerative current $6_7$, is shorter than that in the case where the energy stored in the inductive load L causes the flow of the commutation current $6_3$ so that it is consumed as heat by the NPN transistor $Q_3$, the flywheel diode $D_3$ and the current detecting resistor $R_S$. Thus, the current is quickly attenuated.

The regenerative current $6_7$ does not pass through the current detecting resistor $R_S$. Therefore, when the regenerative current $6_7$ is flowing, the non-inverted terminal of the comparator 24 is connected to the ground potential through the current detecting resistor $R_S$ so that the output $V_C$ of the comparator 24 takes "LOW". Since the output $V_C$ is outputted to the 3-input NOR 52 through the inverter $30_6$, the output $V_9$ of the 3-input NOR 52 takes "LOW" when the regenerative current 67 is flowing. Accordingly, there is no risk that the set terminal S of the FF 54 is raised or the FF 57 is reset.

(6) Return to Steady Operation

Next, explanation will be made of an operation for detecting the lowering of the detection voltage $V_R$ to a value below the variable reference voltage $V_R$ which results from the attenuation of the current flowing through the inductive load L.

During a time when the current flowing through the inductive load L is attenuating, the 3-input NOR 53 is inputted with the signal $V_6$ outputted by the FF 56, the signal $V_1$ outputted by the negative edge detecting circuit 51 and the signal $V_8$ outputted by the comparator 59 but the signal $V_6$ gives no influence upon the output of the 3-input NOR 53 since the signal $V_6$ remains "LOW" when the detection voltage $V_S$ is larger than the variable reference voltage $V_R$. Accordingly, the signal $V_{11}$, outputted by the 3-input NOR 53 takes "LOW" when any one of the signal $V_8$ and the signal $V_1$ is "HIGH" and takes "HIGH" only when both of the signal $V_8$ and the signal $V_1$ are "LOW", as shown in FIG. 4.

Namely, the signal $V_{11}$ takes "HIGH" when the voltage of the sawtooth wave $V_T$ is being lowered and when the voltage of the sawtooth wave $V_T$ is below the reference voltage $V'_R$.

Though the signal $V_{11}$ is inputted to the set terminal S of the FF 57, the signal $V_9$ inputted to the reset terminal R of the FF 57 assumes "HIGH" in the same timing as the signal $V_{11}$ during a time when the inverter $30_6$ continues to output "LOW". Therefore, the output terminal Q of the FF 57 remains "LOW".

Figure 5:
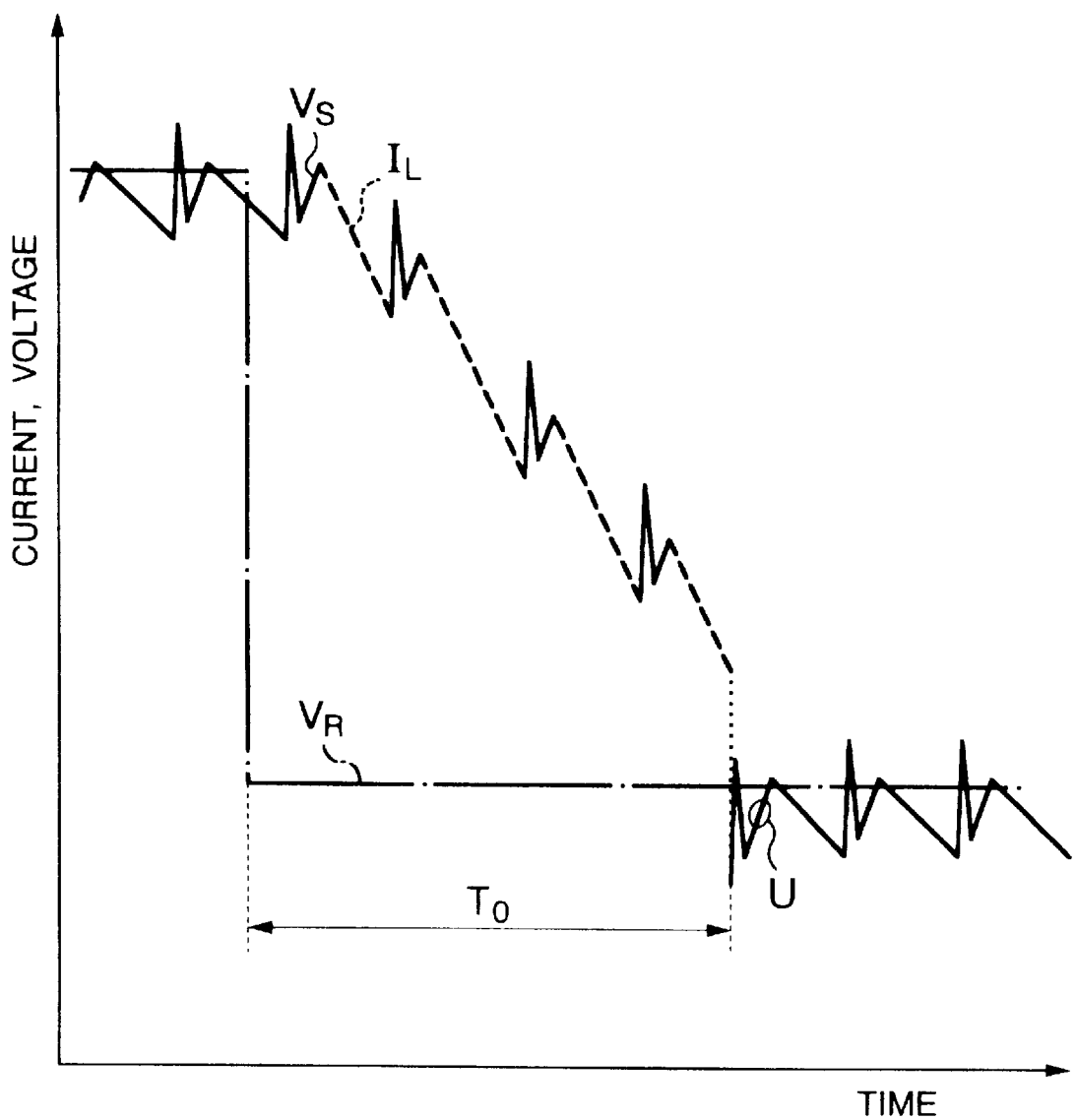
FIG. 5 is a timing chart for explaining the situation of a decrease in current when the power source regeneration is made.

From such a state, a current $I_L$ flowing through the inductive load L decreases, as shown in FIG. 5. When the detection voltage $V_S$ generated at the time of turn-on of the PNP transistor $Q_1$ and the NPN transistor $Q_3$ becomes smaller than the variable reference voltage $V_R$ (or at a time instant indicated by symbol U), the output $V_C$ of the comparator 24 turns into "LOW" so that a "HIGH" signal is outputted from the inverter 306 to the 3-input NOR 52. Thereby, the signal $V_9$ outputted from the 3-input NOR 52 turns into "LOW so that the reset terminal R of the FF 57 turns into "LOW".

Though the set terminal S of the FF 57 is inputted with the signal $V_{11}$, the signal $V_{11}$ at that time is "HIGH". Therefore, the output terminal Q of the FF 57 turns into "HIGH". Thereby, the positive edge detecting circuit 58 detects a positive edge indicating the change from "LOW" to "HIGH" to output a one pulse "HIGH" signal to the set terminal S of the FF 56.

Thereupon, the output terminal Q of the FF 56 changes from "LOW" to "HIGH" which is in turn inputted to the 3-input NAND circuit circuits 52 and 53. Accordingly, both of the outputs $V_9$ and $V_{11}$ of the 3-input NAND circuit circuits 52 and 53 turn into "LOW". After this, "LOW" is outputted irrespective of the states; of the other input terminals of the 3-input NAND circuit circuits 54 and 57.

Accordingly, the output terminal Q of the FF 56 remains "HIGH" so that the set terminal S of the FF 54 and the reset terminal R of the FF 57 are fixed in their "LOW" states. Therefore, the NPN transistor $Q_3$ remains in the turned-on state as mentioned earlier so that the switching current flowing through the inductive load L is kept in a fixed level by the turn-on/off of the PNP transistor $Q_1$. In this case, an energy stored in the inductive load L is consumed by a commutation current $6_3$ shown in FIG. 7.

(Other Embodiments)

Though the foregoing explanation has been made of the case of the H-bridge circuit control device of a power IC structure using bipolar transistors as semiconductor switching elements, the present invention is not limited to the H-bridge circuit control device of the IC structure. An inductive load driving method and an H-bridge circuit control device for driving an H-bridge circuit using MOS transistors are also included in the present invention. Further, the flywheel diode is not limited to the PN junction diode. Any flywheel diode to cause the flow of a rush current for the stray capacitor of the inductive load L may be included widely.

According to the first aspect of the invention, a noise eliminating filter is not required, thereby reducing the cost.

According to the second aspect of the invention, when a switching current flowing through an inductive load is decreased, it is possible to detect whether or not the switching current is decreased down to a desired amplitude. Accordingly, there is no risk that the current flowing through the inductive load becomes too small or the transfer to a steady operation is caused while the current is large. Also, it is not required that a period of time for causing the flow of a regenerative current should be set again for each kind of stepping motors.

I claim:

1. A method of driving an inductive load by using an H-bridge circuit which includes a plurality of semiconductor switching elements and a plurality of flywheel diodes respectively connected in parallel to said plurality of semiconductor switching elements, said H-bridge circuit supplying electric current to said inductive load in both forward and reverse directions, said method comprising the steps of:

(a) generating a control signal having a predetermined frequency;

(b) turning-on at least two of said plurality of semiconductor switching elements in accordance with said control signal to cause said electric current to flow through said inductive load;

(c) decreasing a variable reference voltage in a condition where the electric current flowing through said inductive load is to be decreased to a desired level;

(d) obtaining a detection voltage generated across a current detecting resistor which is connected to said H-bridge circuit so as to detect said electric current flowing from a power source through said inductive load and not to detect said electric current flowing through said inductive load to the power source; and (e) comparing the detection voltage with the variable reference voltage and cutting-off said at least two semiconductor switching elements when the detection voltage is larger than the variable reference voltage so that electric energy accumulated in said inductive load is consumed.

2. A method according to claim 1, wherein step (e) includes ignoring a comparison result of step (e) during a predetermined time period after said at least two semiconductor switching elements are turned-on.

3. An H-bridge circuit control device for controlling an H-bridge circuit which includes a plurality of semiconductor switching elements and a plurality of flywheel diodes respectively connected in parallel to said plurality of semiconductor switching elements, said H-bridge circuit supplying electric current to said inductive load in both forward and reverse directions, said device comprising:

(a) control signal generating means for generating a control signal having a predetermined frequency;

(b) control means for turning-on at least two of said plurality of semiconductor switching elements in accordance with said control signal to cause said electric current to flow through said inductive load;

(c) a current detecting resistor connected to said H-bridge circuit so as to detect the electric current flowing from a power source through said inductive load and not to detect the electric current flowing through said inductive load to the power source, thereby obtaining a detection voltage;

(d) a variable reference voltage generating circuit for decreasing a variable reference voltage in a condition where said electric current flowing through said inductive load should be decreased; and (e) comparing means for comparing the detection voltage with the variable reference voltage, wherein:

said control means cuts-off said at least two semiconductor switching elements when the detection voltage is larger than the variable reference voltage so that electric energy accumulated in said inductive load is consumed.

4. A device according to claim 3, wherein said control means ignores a comparison result of said comparing means during a predetermined time period after said at least two semiconductor switching elements are turned-on.

\* \* \* \* \*